United States Patent
Smith et al.

(10) Patent No.: US 6,184,065 B1
(45) Date of Patent: Feb. 6, 2001

(54) PHOTOLITHOGRAPHICALLY PATTERNED SPRING CONTACT

(75) Inventors: Donald Leonard Smith, Palo Alto; Andrew Sebastian Alimonda, Los Altos, both of CA (US)

(73) Assignee: Xerox Corporation, Stamford, CT (US)

(*) Notice: Under 35 U.S.C. 154(b), the term of this patent shall be extended for 0 days.

(21) Appl. No.: 09/276,098

(22) Filed: Mar. 25, 1999

Related U.S. Application Data

(63) Continuation of application No. 08/771,405, filed on Dec. 20, 1996, now Pat. No. 5,914,218, which is a continuation of application No. 08/478,578, filed on Jun. 7, 1995, now Pat. No. 5,613,861.

(51) Int. Cl.[7] .......................... H01L 21/44; H01L 21/48; H01L 21/50

(52) U.S. Cl. .............................. 438/117; 438/611

(58) Field of Search ..................... 438/117, 611

(56) References Cited

U.S. PATENT DOCUMENTS

| | | |
|---|---|---|
| 2,562,685 | 7/1951 | Adams . |
| 3,356,369 | 12/1967 | Stubbmann . |
| 3,826,984 | 7/1974 | Epple . |
| 3,842,189 | 10/1974 | Southgate . |
| 4,320,438 | 3/1982 | Ibrahim et al. . |
| 4,423,401 | 12/1993 | Mueller . |
| 4,535,219 | * 8/1985 | Silwa, Jr. . |
| 4,758,927 | 7/1988 | Berg . |
| 5,090,118 | 2/1992 | Kwon et al. . |
| 5,121,298 | 6/1992 | Sarma et al. . |
| 5,152,695 | 10/1992 | Grabbe et al. . |
| 5,280,139 | 1/1994 | Suppelsa et al. . |
| 5,463,246 | * 10/1995 | Matsunami . |
| 5,487,999 | 1/1996 | Farnworth . |
| 5,513,430 | 5/1996 | Yanof et al. . |
| 5,665,648 | 9/1997 | Little . |

FOREIGN PATENT DOCUMENTS

| | | |
|---|---|---|
| 6-249880 | 9/1994 | (JP) . |
| 6249880 | 9/1994 | (JP) . |
| 76855 | 5/1950 | (NO) . |
| 9409374 | 4/1994 | (WO) . |
| 9-641506 | 12/1996 | (WO) . |

OTHER PUBLICATIONS

A.E. "Bill" Corwith, "Probing at Die Level", *Advanced Packaging*, Jan./Feb. 1995, p. 26 & 28 IBM Technical Disclosure vol. 34 No. 78, Dec. 1991.

Donald L. Smith et al., "Flip–Chip Bonding On 6–Um Pitch Using Thin–Film Microspring Technology," to be published in *Proc. 48th Electronic Components And Technology Conf.*, May 1998.

Donald L. Smith et al., "A New Flip–Chip Technology for High–Density Packaging," *Proc. 46th Electronic Components and Technology Conf.*, May 1996.

Donald L. Smith et al., "A New, High–Compliance Flip–Chip Technology," *Display Works Conference*, Feb. 1996.

(List continued on next page.)

Primary Examiner—David E. Graybill
(74) Attorney, Agent, or Firm—Oliff & Berridge, PLC

(57) ABSTRACT

A photolithographically patterned spring contact is formed on a substrate and electrically connects contact pads on two devices. The spring contact also compensates for thermal and mechanical variations and other environmental factors. An inherent stress gradient in the spring contact causes a free portion of the spring contact to bend up and away from the substrate. An anchor portion remains fixed to the substrate and is electrically connected to a first contact pad on the substrate. The spring contact is made of an elastic material and the free portion compliantly contacts a second contact pad, thereby electrically interconnecting the two contact pads.

79 Claims, 14 Drawing Sheets

OTHER PUBLICATIONS

K. Bohringer, "Computational Methods for Design and Control of MEMS Actuator Arrays," Sep. 12, 1997, Abstract from Seminar.

A. Lee, J. Hamilton, J. Trevino, "A Low Power, Tight Seal, Polyimide Electrostatic Microvalve," Micro–Electro–Mechanical Systems ASME, Dynamic Systems and Control Division Publication, v. 56, pp. 345–349, Nov. 17, 1996.

* cited by examiner

PHOTOLITHOGRAPHICALLY PATTERNED SPRING CONTACT

This is a Continuation of application Ser. No. 08/771,405, filed Dec. 20, 1996, U.S. Pat. No. 5,914,218, which is a continuation of application Ser. No. 08/478,578 filed Jun. 7, 1995 U.S. Pat. No. 5,613,864. The entire disclosure of the prior application(s) is hereby incorporated by reference herein in its entirety.

BACKGROUND OF THE INVENTION

1. Field of the Invention

This invention generally relates to photolithographically-patterned spring contacts for use in electrically bonding integrated circuits, circuit boards, electrode arrays, or other devices.

2. Description of Related Art

Standard bonding techniques for electrically connecting integrated circuits, or chips, to a circuit board or other device include wire bonding, tab bonding, solder-bump and gold-bump flip-chip bonding and other techniques. FIG. 1 shows a contact pad 3 formed on a chip 2 wire bonded to a corresponding contact pad 3 formed on a substrate 1. The contact pads 3 are electrically connected, or bonded, by a wire 4. Since the chip 2 typically has tens or even hundreds of the contact pads 3, wire bonding each contact pad 3 on the chip 2 to the corresponding contact pad 3 on the substrate 1 is labor intensive, expensive and slow. Further, the contact pads 3 must be large enough to accommodate both the wire 4 and the accuracy of the wire bonding device used to create the wire bond. Therefore, the contact pads 3 are made larger than otherwise necessary to compensate for the size limitations of the wire 4 and the wire bonding device.

FIG. 2 shows the contact pad 3 formed on the chip 2 tab bonded to the corresponding contact pad 3 on the substrate 1. A flexible substrate 5 having conductive lines formed on its lower surface is forced against the contact pads 3. A layer of anisotropic adhesive (not shown) is placed between the contact pads 3 and the flexible substrate 5. When the flexible substrate 5 is pressed against the contact pads 3, the anisotropic adhesive and the conductive lines formed on the flexible substrate 5 cooperate to complete the electrical connection between the contact pads 3. Like wire bonding, tab bonding suffers from yield loss, bond fragility, and high cost.

Another conventional method for bonding the contact pads 3 formed on the chip 2 to the contact pads 3 formed on the substrate 1 or to some other device is solder-bump flip-chip bonding. FIG. 3 shows the chip 2 inverted with the contact pads 3 facing toward the substrate 1. The name "flip-chip" derives from the inversion of the chip 2, since the chip 2 is "flipped over" with the contacts pads 3 facing the substrate 1, in contrast to both tab bonding and wire bonding where the contact pads 3 on the chip 2 face away from the substrate 1. Note, however, that tab bonding can also be done with the chip 2 "flipped over". In standard flip-chip bonding, solder bumps 6 are formed on the contact pads 3 on the substrate 1 or on the chip 2. The electrical connection between the corresponding contact pads 3 is completed by pressing the contact pads 3 on the chip 2 against the solder bumps 6 and melting the solder bumps 6.

Flip-chip bonding is an improvement over both wire bonding and tab bonding. The relatively soft solder bumps 6 tend to permanently deform when the chip 2 is pressed down against the solder bumps 6. This deformation of the solder bumps 6 compensates for some irregularity in the heights of the contact pads 3 and any uneven contacting pressure forcing the chip 2 against the solder bumps 6.

However, flip-chip bonding does suffer from both mechanical and thermal variations in the solder bumps 6. If the solder bumps 6 are not uniform in height or if the substrate 1 is warped, contact between the contact pads 3 and the solder bumps 6 can be broken. Also, if the contacting pressure forcing the chip 2 down on the solder bumps 6 is uneven, contact between some contact pads 3 and corresponding solder bumps 6 can fail. In addition, stresses from thermal expansion mismatches between the chip 2 and the substrate 1 can break the bonds formed by the solder bumps 6.

In contrast to the relatively permanent bonds described above, FIG. 4 shows a standard technique for establishing a temporary electrical contact between two devices. A probe card 7 having a plurality of probe needles 8 contacts the contact pads 3 by physically pressing the probe needles 8 against the contact pads 3. The physical contact between the probe needles 8 and the contact pads 3 creates an electrical connection between the probe needles 8 and the lines 9 formed on the substrate 1.

The probe cards 7 are generally used to create only temporary contacts between the probe needles 8 and the contact pads 3, so that the device 10 can be tested, interrogated or otherwise communicated with. The device 10 can be a matrix of display electrodes which are part of an active-matrix liquid crystal display. Testing of the devices 10, such as liquid crystal display electrode matrices, is more thoroughly described in an U.S. patent application Ser. No. 08/473,912 to the same inventor, co-filed and co-pending herewith and herein incorporated by reference.

The probe cards 7 have many more applications than only for testing liquid crystal displays. Any device 10 having numerous and relatively small contact pads 3, similar to those found on the chip 2, can be tested using the probe card 7. However, standard techniques for producing the probe card 7 are time consuming and labor-intensive. Each probe card 7 must be custom-made for the particular device 10 to be tested. Typically, the probe needles 8 are manually formed on the probe card 7. Because the probe cards 7 are custom-made and relatively expensive, the probe cards 7 are not typically made to contact all of the contact pads 3 on the device 10 at one time. Therefore, only portions of the device 10 can be communicated with, tested or interrogated at any one time, requiring the probe card 7 be moved to allow communication, testing or interrogation of the entire device 10.

The probe cards 7 are also used to test the chips 2 while the chips 2 are still part of a single-crystal silicon wafer. One such probe card 7 is formed by photolithographic pattern plated processing, as disclosed in *Probing at Die Level*, Corwith, Advanced Packaging, February, 1995, pp. 26–28. Photolithographic pattern plated processing produces probe cards 7 which have essentially the same design as the standard probe card 7. However, this new type of processing appears to automate the method for producing probe needles 8, thus avoiding manually forming the probe needles 8. Also, this article discloses a probe card 7 which is bent at the end nearest the probe needles 8, as shown in FIG. 5. The bend in the probe card 7 allows the probe needles 8 to contact the contact pad 3 at an angle. As the probe card 7 pushes the probe needles 8 into the contact pads 3, a mechanical scrubbing action occurs which allows the probe needles 8 to break through the oxide formed on the top surface of the contact pad 3. All of the standard probe cards 7, however, are limited to testing contact pads 3 which are arranged in a linear array.

SUMMARY OF THE INVENTION

Accordingly, this invention provides a spring contact which exhibits the speed and ease of solder-bump flip-chip bonding while eliminating the need to create uniform solder bumps or uniform contacting pressure. Also, the invention provides finer-pitch contact arrays than solder-bump flip-chip bonding.

This invention further provides a spring contact which has elastic properties enabling the spring contact to maintain physical contact with a contact pad despite variations in contact pad heights, contacting pressure, thermal variations or mechanical shock.

This invention also provides an elastic spring contact having a stress gradient formed in the spring contact, which causes the spring contact to bend away from the substrate and thus provide compliant contact with a contact pad.

This invention further provides a probe card and a method for producing the probe card having spring contacts in place of standard probe needles.

The spring contacts of this invention are formed of a thin metal strip which is in part fixed to a substrate and electrically connected to a contact pad on the substrate. The free portion of the metal strip not fixed to the substrate bends up and away from the substrate. When the contact pad on a device is brought into pressing contact with the free portion of the metal strip, the free portion deforms and provides compliant contact with the contact pad. Since the metal strip is electrically conductive or coated with a conductive material, the contact pad on the substrate is electrically connected to the contact pad on the device via the spring contact.

BRIEF DESCRIPTION OF THE DRAWINGS

This invention will be described in relation to the following drawings, in which reference numerals refer to like elements and wherein.

DETAILED DESCRIPTION OF THE PREFERRED EMBODIMENTS

Figure 1:
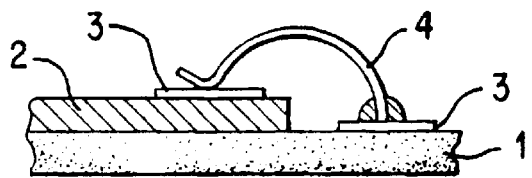
FIG. 1 shows a chip wire bonded to a substrate.
Figure 2:
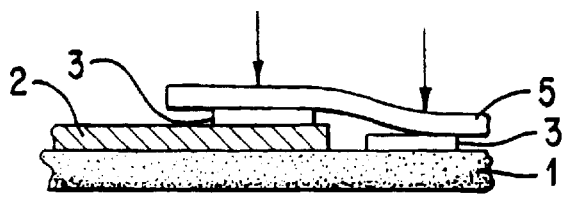
FIG. 2 shows the chip tab bonded to the substrate.
Figure 3:
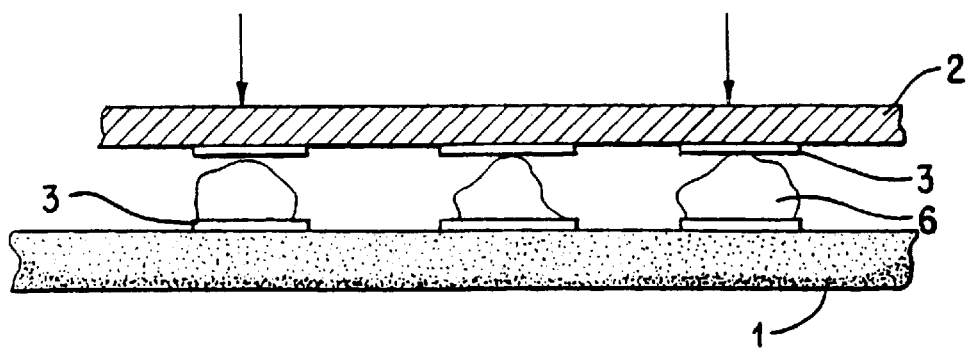
FIG. 3 shows the chip solder-bump flip-chip bonded to the substrate.
Figure 4:
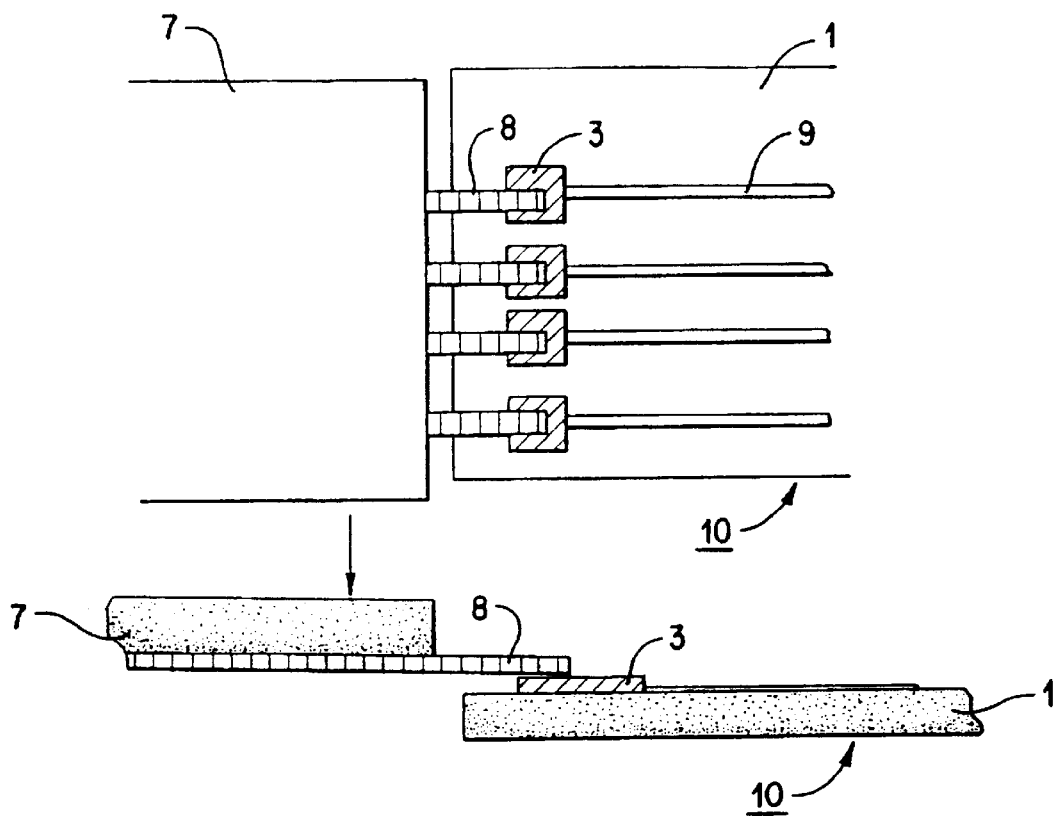
FIG. 4 shows a probe card contacting an electronic device.
Figure 5:
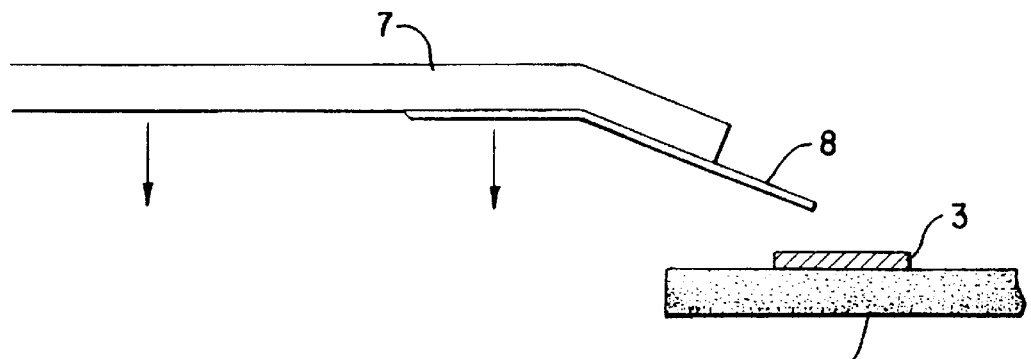
FIG. 5 shows a probe card having an angled probe needle.
Figure 6:
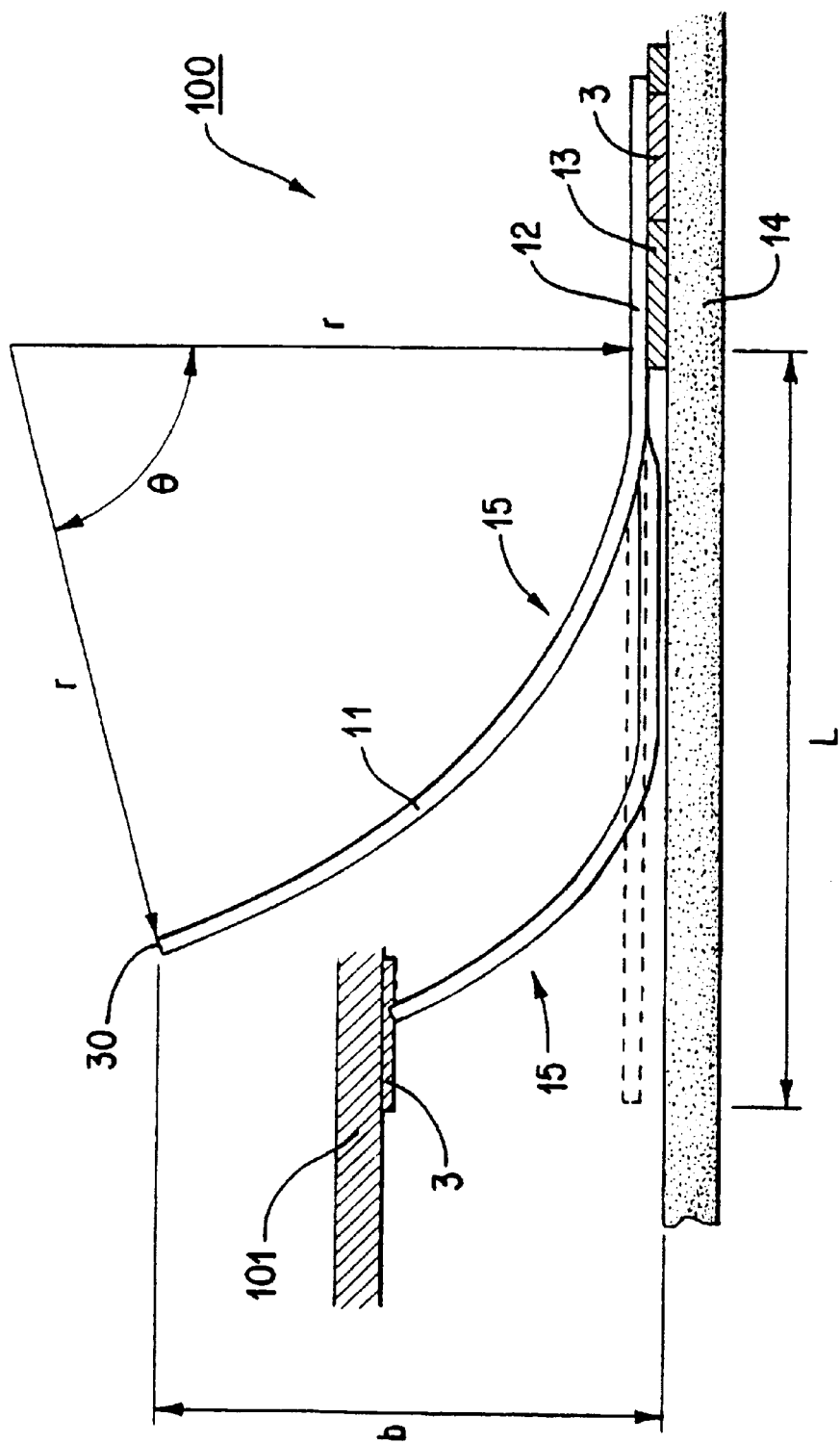
FIG. 6 is a spring contact in an undeformed free state and another spring contact deformed when contacting a contact pad.

FIG. 6 shows a side view of a bonding structure 100 having a plurality of spring contacts 15. Each spring contact 15 comprises a free portion 11 and an anchor portion 12 fixed to an insulating underlayer 13 and electrically connected to a contact pad 3. Each spring contact 15 is made of an extremely elastic material, such as a chrome-molybdenum alloy or a nickel-zirconium alloy. Preferably, the spring contacts 15 are formed of an elastic conductive material, although they can be formed of a non-conductive or semi-conductive material if they are coated or plated with a conductor material. More preferably, the spring contacts 15 are formed of a nickel-zirconium alloy having 1% zirconium. Zirconium is added to the nickel to improve the elastic properties of the alloy while not greatly reducing the conductivity of the nickel. When the elastic material is not conductive, it is coated on at least one side with a conductive material, such as a metal or metal alloy.

The contact pad 3 is the terminal end of a communication line which electrically communicates with an electronic device formed on the substrate 14 or device 101 such as a transistor, a display electrode, or other electrical device. The contact pad 3 is typically made of aluminum, but can be made of any conductive material. If the contact pad 3 on device 101 is made of aluminum, the contact pad 3 is preferably coated with a conductive material, such as gold, indium tin oxide, or nickel. This allows the spring contact 15 to make better electrical contact with the contact pad 3, since the spring contact 15 cannot "scrub" the uncoated contact pad 3 to break through the aluminum oxide that forms on an uncoated aluminum contact pad 3. The insulating underlayer 13 is made of silicon nitride or other etchable insulating material. However, the insulating underlayer 13 is not necessary and can be eliminated. The insulating underlayer 13 and the contact pad 3 are formed on or over a substrate 14, which is also formed of an insulating material, such as oxidized silicon or glass.

Figure 7:
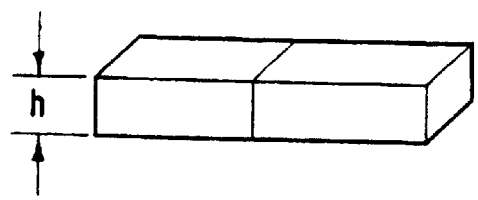
FIG. 7 shows a metal strip with no stress gradient.
Figure 8:
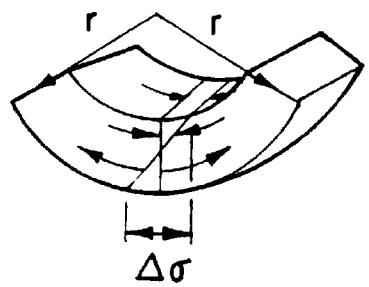
FIG. 8 shows a model for determining the curvature of a spring contact due to the stress gradient.

As shown in FIG. 7, a strip of metal having no stress gradient inherent in the metal will lie flat. However, as shown in FIG. 8, when the strip is bent into an arc, a uniform stress gradient $\Delta\sigma/h$ is introduced into the strip. Likewise, if a uniform stress gradient $\Delta\sigma/h$ is introduced into the flat metal strip, the metal strip will bend into an arc shape.

Each spring contact 15 is formed such that a stress gradient $\Delta\sigma/h$ is introduced into the spring contact 15. When the spring contact 15 is formed, the metal layer comprising the spring contact 15 is deposited such that compressive stress is present in lower portions of the metal layer and tensile stress is present in upper portions of the metal layer.

Compressive stress in lower portions of the metal layer is depicted by arrows directed to the left. Tensile stress is depicted in upper portions of the metal layer by arrows directed to the right. The stress gradient Δσ/h causes the spring contact 15 to bend into the shape of an arc having a radius r. Equation 1 gives the radius of curvature r of the spring contact 15:

$$r = \left(\frac{Y}{1-v}\right)\frac{h}{\Delta\sigma} \quad (1)$$

where Y is the Young's modulus of the metal, h is the thickness of the metal layer forming the spring contact 15, Δσ is the total stress difference, and v is the Poisson's ratio of the metal.

Referring again to FIG. 6, r is the radius of curvature of the free portion 11 of the spring contact 15 as predicted in Equation 1, and ∂ is the angle separating the radius line directed toward the junction of the free portion 11 with the anchor portion 12 and the radius line directed toward the tip 30 of the free portion 11. Equation 2 gives the approximate height b of the spring contact tip 30 from the substrate 14 for angles ∂<50°:

$$b \approx \frac{L^2}{2r} \quad (2)$$

where L is the length of the free portion 11 and r is the radius of curvature of the free portion 11.

Since each spring contact 15 is preferably made of a highly elastic material, each spring contact 15 can be pushed down at the tip 30 and deformed as shown in FIG. 6, but will not plastically deform. Typically, a contact pad 3 of a device 101 exerts the downward force placed on the tip 30 and electrically contacts the tip 30. The spring contact 15 resists the downward force placed on the tip 30 and maintains electrical contact with the contact pad 3.

When the force on the tip 30 is released, the spring contact will return to its undeformed state. Thus, the elasticity of the spring contacts 15 allows the spring contacts 15 to make numerous successive electrical connections with different contact pads 3 while maintaining the integrity of the electrical connection between the spring contact tip 30 and the contact pads 3.

Additionally, the spring contact 15 is preferably made of a creep-resistant material. Therefore, when the spring contact 15 is elastically deformed over an extended period by a contact pad 3 pressing down on the spring contact tip 30, the spring contact 15 resists the downward force and pushes the spring contact tip 30 against the contact pad 3, maintaining the electrical connection.

Figure 9:
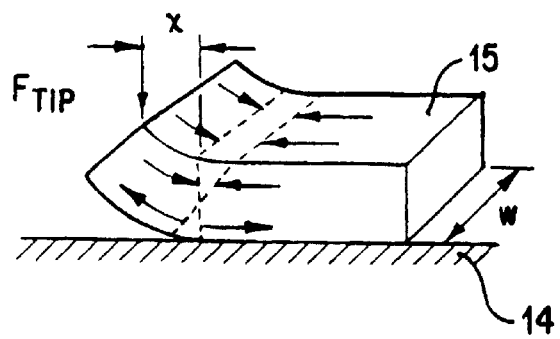
FIG. 9 shows a model for determining the amount of reaction force exerted at the tip of the spring contact.

FIG. 9 shows a model for determining the amount of force Ftip applied by the spring contact tip 30 to a contact pad 3 in reaction to the force of the contact pad 3 pressing down on the spring contact tip 30. Equation 3 gives the reaction force $F_{tip}$ of the spring contact tip 30:

$$F_{tip} = \frac{wh^2\Delta\sigma}{12x} \quad (3)$$

where w is the width of the spring contact 15, h is the thickness of the spring contact 15, Δσ is the total stress difference and x is the horizontal distance from the spring contact tip 30 to the point where the spring contact 15 first touches the substrate 14.

For a given width w, thickness h and stress difference Δσ, the reaction force $F_{tip}$ of the tip 30 varies inversely with the distance x. Therefore, the reaction force $F_{tip}$ increases as the spring contact tip 30 gets closer to the substrate 14, since the distance x decreases as the spring contact 15 collapses and presses against the substrate 14 as shown in FIG. 6. The increase in the reaction force $F_{tip}$ as the contact pad 3 presses the spring contact tip 30 closer to the substrate 14 generally improves the electrical connection between the spring contact tip 30 and the contact pad 3. The increasing reaction force $F_{tip}$ causes the spring contact tip 30 and/or the contact pad 3 to deform locally at the area of contact, increasing the area of contact between the contact pad 3 and the spring contact tip 30.

Figure 10:
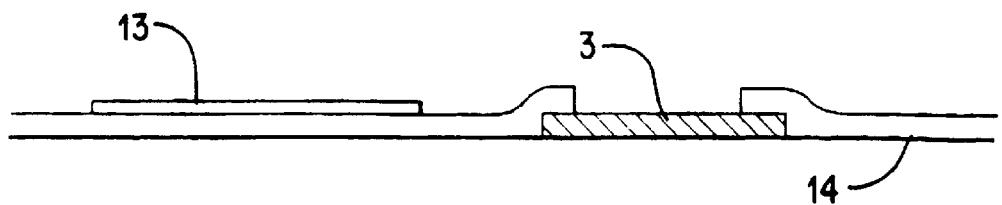
FIGS. 10–13 show the steps for forming a spring contact.

FIGS. 10–13 show the basic steps in forming a spring contact 15. In FIG. 10, a contact pad 3 is formed on or over a substrate 14. Additionally, an insulating underlayer 13 is formed on or over the substrate 14. However, as mentioned above, the insulating underlayer 13 is not required and can be eliminated.

Figure 11:
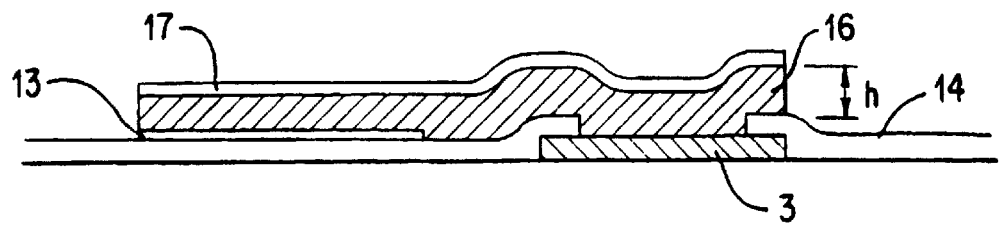

In FIG. 11, a layer of metal 16 is deposited on or over the substrate 14. In the preferred embodiment of the invention, the metal is the nickel-zirconium alloy described above. Part of the metal layer 16 is electrically connected to or directly contacts the contact pad 3 and another portion of the metal layer 16 is deposited on or over the insulating underlayer 13. There are many methods available for depositing a metal layer 16 on or over the substrate 14, including electron-beam deposition, thermal evaporation, chemical vapor deposition, sputter deposition and other methods. Preferably, the metal layer 16 is sputter deposited.

When sputter-depositing a metal, a plate of the metal, called the target, is placed on a cathode, which is set to a high negative potential and immersed in a low-pressure, typically 1 to 100 millitorr, gas. This causes a glow-discharge plasma to ignite, from which positive ions are accelerated into the negatively charged target. This ion bombardment knocks metal atoms off the target, and many of these deposit on nearby surfaces, such as the substrate 14.

The metal layer 16 can be thought of as deposited in several sub-layers 16-1 to 16-$n$ to a final thickness h of approximately 1 μm. The stress gradient Δσ/h is introduced into the metal layer 16 by altering the stress inherent in each of the sub-layers 16-1 to 16-$n$ of the metal layer 16, as shown in FIG. 11, each sub-layer 16-$x$ having a different level of inherent stress.

Different stress levels can be introduced into each sub-layer 16-$x$ of the deposited metal layer 16 during sputter deposition in a variety of ways, including adding a reactive gas to the plasma, depositing the metal at an angle, and changing the pressure of the plasma gas. Preferably, the different levels of stress are introduced into the metal layer 16 by varying the pressure of the plasma gas, which is preferably argon.

Figure 14:
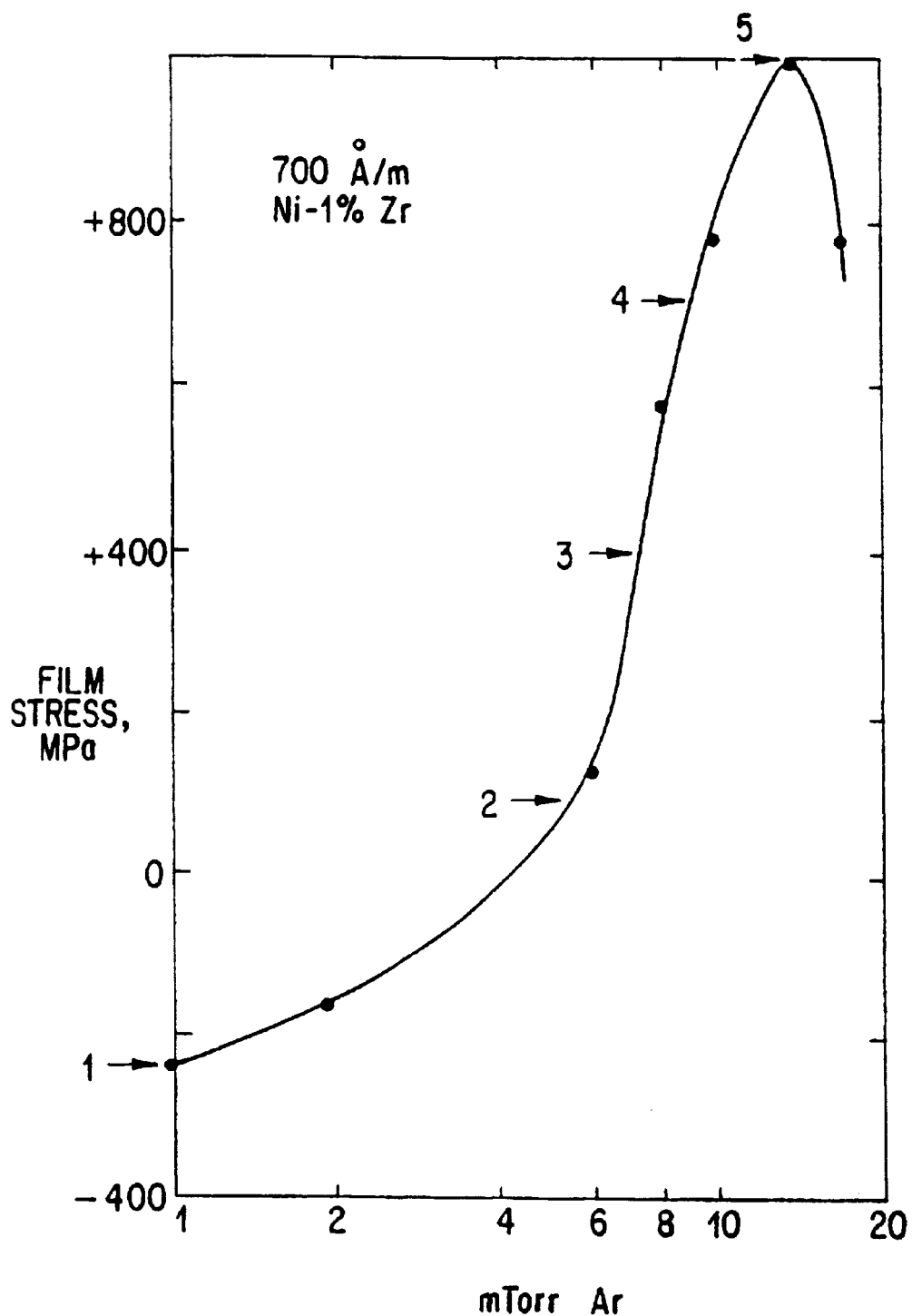
FIG. 14 is a graphic representation of the film stress in a sputter deposited nickel-zirconium alloy as a function of plasma gas pressure.

FIG. 14 is a graph showing a typical relationship of the film stress in the sputter deposited nickel-zirconium alloy and the pressure of the plasma gas used in the deposition. For low pressures of the plasma gas, approximately 1 mTorr, the film stress in the deposited metal is compressive. As the pressure of the plasma gas increases, the film stress in the deposited sub-layer changes to a tensile stress and increases with increasing plasma gas pressure.

Preferably, the metal layer 16 is deposited in five sub-layers 16-1 to 16-5. The first sub-layer 16-1 is deposited at a plasma gas pressure of 1 mTorr, as indicated by numeral 1 in FIG. 14. The first sub-layer 16-1 is the bottom-most layer in the metal layer 16 and has an inherent compressive stress. The second sub-layer 16-2 is deposited on top of the first sub-layer 16-1 at a plasma gas pressure of approximately 6 mTorr. The second sub-layer 16-2 has a slight inherent tensile stress, as indicated by numeral 2 in FIG. 14. Sub-layers 16-3, 16-4 and 16-5 are then deposited one on top of the other at the plasma gas pressures indicated by numerals 3, 4 and 5 in FIG. 14.

The process of depositing the metal layer 16 in five separate sub-layers 16-1 to 16-5 results in the metal layer 16 having a stress gradient $\Delta\sigma/h$ which is compressive in the lower portion of the metal layer 16 and becomes increasingly tensile toward the top of the metal layer 16. Although the stress gradient $\Delta\sigma/h$ urges the metal layer 16 to bend into an arc, the metal layer 16 adheres to the insulating underlayer 13, the substrate 14 and the contact pad 3 and thus lies flat.

Figure 15:
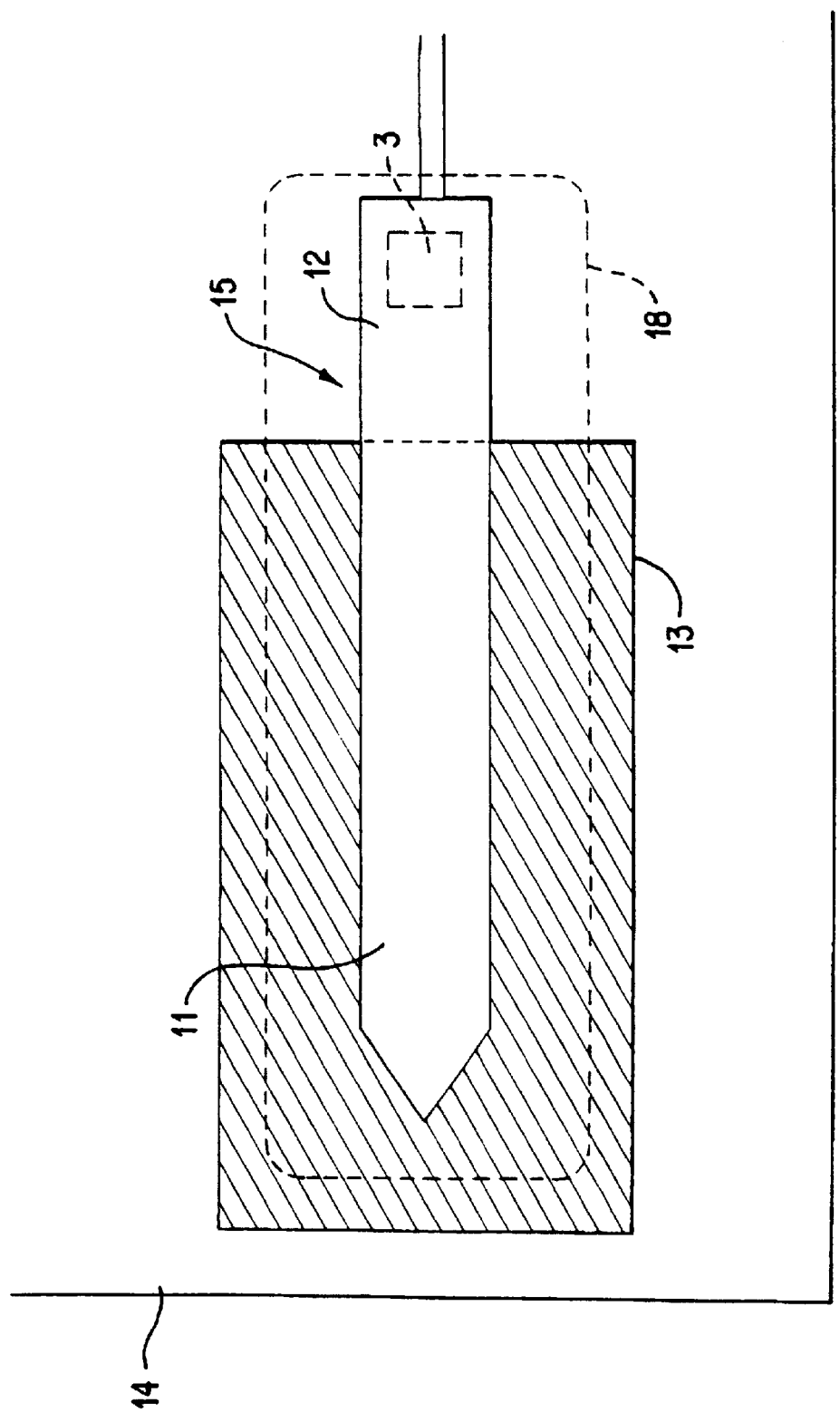
FIG. 15 is a top view of a spring contact.
Figure 16:
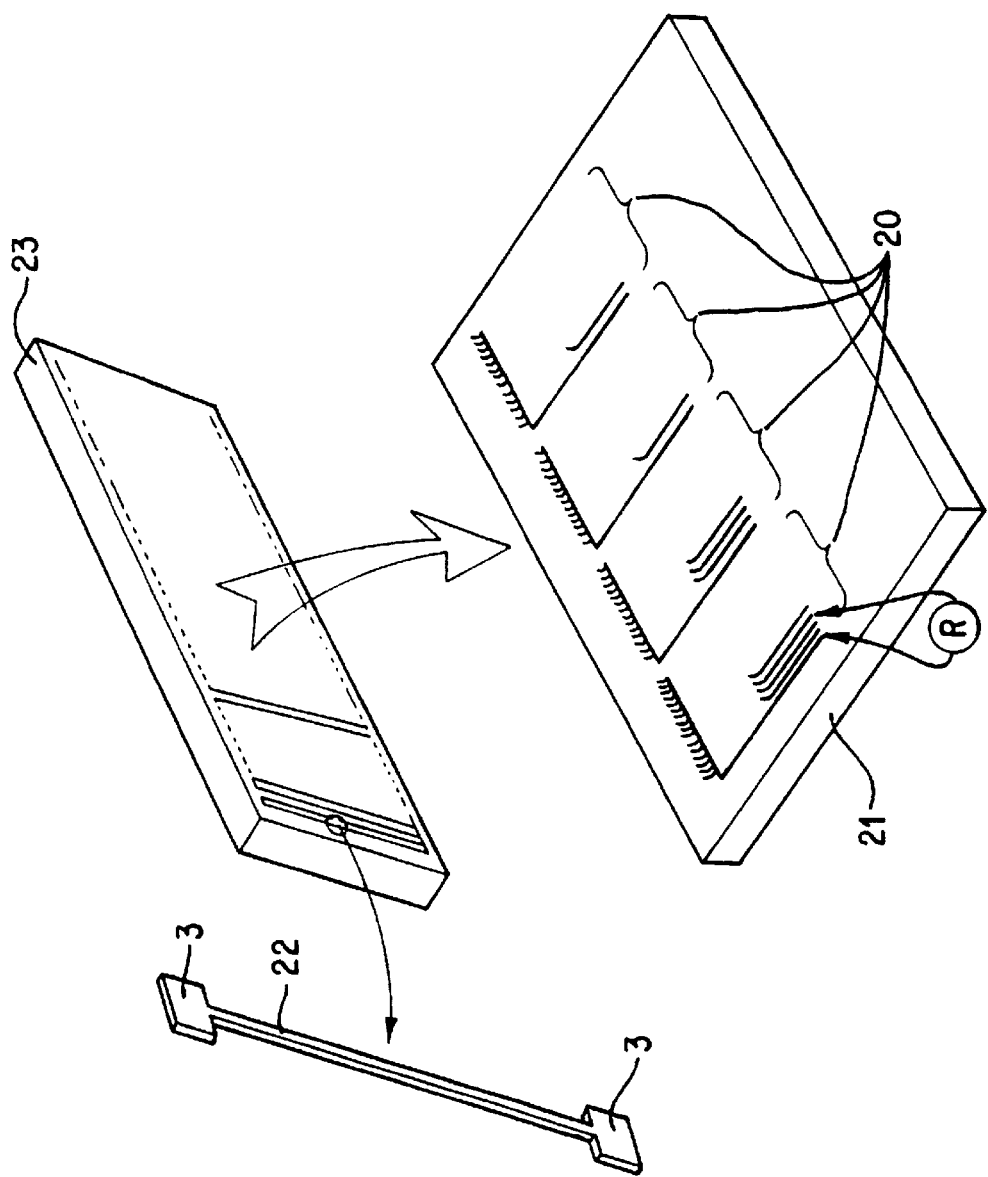
FIG. 16 is a device for testing the contact resistance of a plurality of spring contact pairs.

After the metal layer 16 is deposited, the metal layer 16 is photolithographically patterned into the spring contacts 15. Photolithographic patterning is a well-known technique and is routinely used in the semiconductor chip industry. First, a positive photosensitive resist 17 is spun on top of the metal layer 16 and soft-baked at 90° C. to drive off solvents in the resist 17. The photosensitive resist 17 is exposed to an appropriate pattern of ultra-violet light and then developed. Exposed areas of the resist 17 are removed during developing and the remaining resist 17 is hard-baked at 120° C. Wet or plasma etching is then used to remove the exposed areas of the metal layer 16. The remaining areas of the metal layer 16 after etching form the spring contacts 15. A top-view of one spring contact 15 is shown in FIG. 15. The area of the metal layer 16 removed by the etching is described by the dashed line 18.

Figure 12:
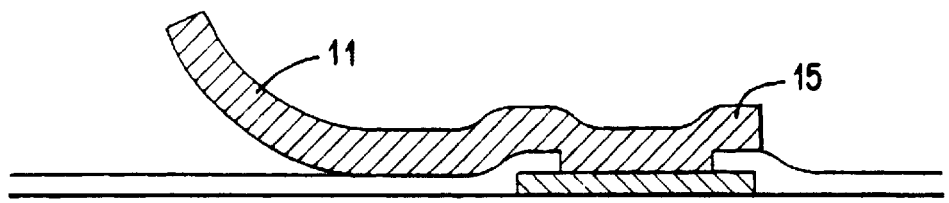

Next, as shown in FIG. 12, the free portion 11 of the spring contact 15 is released from the insulating underlayer 13 by a process of under-cut etching. Until the free portion 11 is released from the insulating underlayer 13, the free portion 11 adheres to the insulating underlayer 13 and the spring contact 15 lies flat on the substrate 14. There are two methods for releasing the spring contacts 15 from the substrate 14 or insulating underlayer 13. In the first method, the insulating underlayer 13, typically silicon nitride, is deposited by plasma chemical vapor deposition (PECVD) at a temperature of 200–250° C. This gives the insulating underlayer 13 a fast etch rate. The insulating underlayer 13 is then pre-patterned, before the metal layer 16 is deposited, into islands on which the spring contacts 15 will be formed. After the spring contacts 15 are formed on or over the islands of the insulating underlayer 13, the spring contacts 15 are released from the insulating underlayer 13 islands by etching the islands with a selective etchant. The selective etchant is typically a HF solution. The etchant is called a selective etchant because it etches the insulating underlayer 13 faster than the selective etchant removes metal from the spring contacts 15. This means that the spring contacts 15 are released from the insulating underlayer 13 and are allowed to bend up and away from the insulating underlayer 13 due to the stress gradient $\Delta\sigma/h$ in the spring contacts 15. The islands can also be formed of a low melting temperature material, such as solder or plastic. After the spring contacts 15 are formed, the low melting temperature material is heated to release the spring contacts 15.

In the second method for releasing the spring contacts 15, the insulating underlayer 13, if used, is not pre-patterned into islands. Instead, after the spring contacts 15 are formed, a passivating layer, such as silicon oxynitride, is deposited on the spring contacts 15 and the surrounding areas by PECVD. The passivation layer is patterned into windows, such as the shaded area shown in FIG. 15, to expose the free portion 11 of the spring contacts 15 and surrounding areas of the insulating underlayer 13. The same selective etchant, the HF solution, is used to etch the insulating underlayer 13 and release the spring contacts 15. This method avoids a step discontinuity in the metal of the spring contact 15 at the anchor portion 12 edge and leaves an insulating cover on the anchor portion 12. The insulating cover protects the anchor portion 12 from short-circuiting and also helps hold the anchor portion 12 down on the substrate 14.

Only those areas of the insulating underlayer 13 under the free portion 11 of the spring contact 15 are under-cut etched. The area of insulating underlayer 13 under-cut etched for each spring contact 15 is described by the shaded portion in FIG. 15. This means that the anchor portion 12 of the spring contact 15 remains fixed to the insulating underlayer 13 and does not pull away from the insulating underlayer 13. It should be appreciated that the method for patterning the metal layer 16 into the spring contacts 15 should not result in any annealing of the metal layer 16.

Additional steps can be added to the under-cut etching processes to improve the processes if necessary. For example, etchant vias, or small windows, can be etched into the free portions 11 of the spring contacts 15. The etchant vias operate to provide the selective etchant faster access to the insulating underlayer 13, thereby speeding the process of releasing the free portions 11 from the insulating underlayer 13. Also, a hard mask, made of, for example, silicon, can be applied to the top surface of the spring contacts 15 to ensure that the etchant does not remove material from the top surface of the spring contacts 15 in case the photosensitive material 17 protecting the top of the spring contacts 15 fails during patterning of the spring contact 15.

Once the free portion 11 is freed from the insulating underlayer 13, the stress gradient $\Delta\sigma/h$ causes the free portion 11 to bend up and away from the substrate 14. The stress gradient $\Delta\sigma/h$ is still inherent in the anchor portion 12 and urges the anchor portion 12 to pull away from the substrate 14.

To decrease the chance of the anchor portion 12 pulling away from the substrate 14, the spring contact 15 can be annealed to relieve the stress in the anchor portion 12. This annealing process does not affect the free portion 11 because, once the free portion 11 is released and allowed to bend up, no stress remains on the free portion 11 to be relieved by annealing. Thus, the free portion 11 remains curved up and away from the substrate 14 after annealing.

Figure 13:
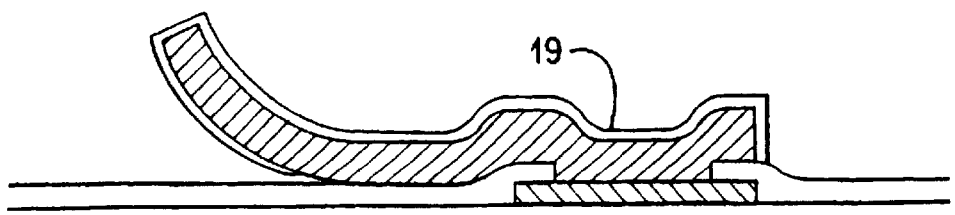

Finally, FIG. 13 shows a layer of gold 19 plated over the outer surface of each spring contact 15. The layer of gold 19 is preferably used to reduce the resistance in the spring contacts 15, but can be replaced with any other conductive material. Preferably, the gold layer 19 is plated on the spring contacts 15 using an electroless plating process.

Since the process for forming the spring contacts 15 is limited only by the design rules of photolithographic patterning, many hundreds or thousands of spring contacts 15 can be formed closely together in a relatively small area on the substrate 14. The typical width w of the spring contact 15 is 10–100 $\mu$m. Therefore, the spring contacts 15 can be formed close together, at a spacing of approximately 10–20 $\mu$m. This makes the center-to-center distance between adjacent spring contacts 15 approximately 20–120 $\mu$m, which is within or less than the typical center-to-center distance between adjacent contact pads 3 on a standard semiconductor chip 2.

To test the effectiveness of the spring contacts 15 in applications similar to those found in solder-bump flip-chip bonding, a test array of the spring contacts 15 at a center-to-center spacing of 80 $\mu$m was developed as shown in FIG.

16. Four sets of arrays 20 of the spring contacts 15 were formed on a bottom substrate 21. Four corresponding arrays of linked contact pads 22 were formed on an upper substrate 23. The upper substrate 23 and the lower substrate 21 were brought together such that the spring contacts 15 contacted a corresponding contact pad 3. The resistance R was then measured across pairs of the spring contact 15 leads.

Figure 17:
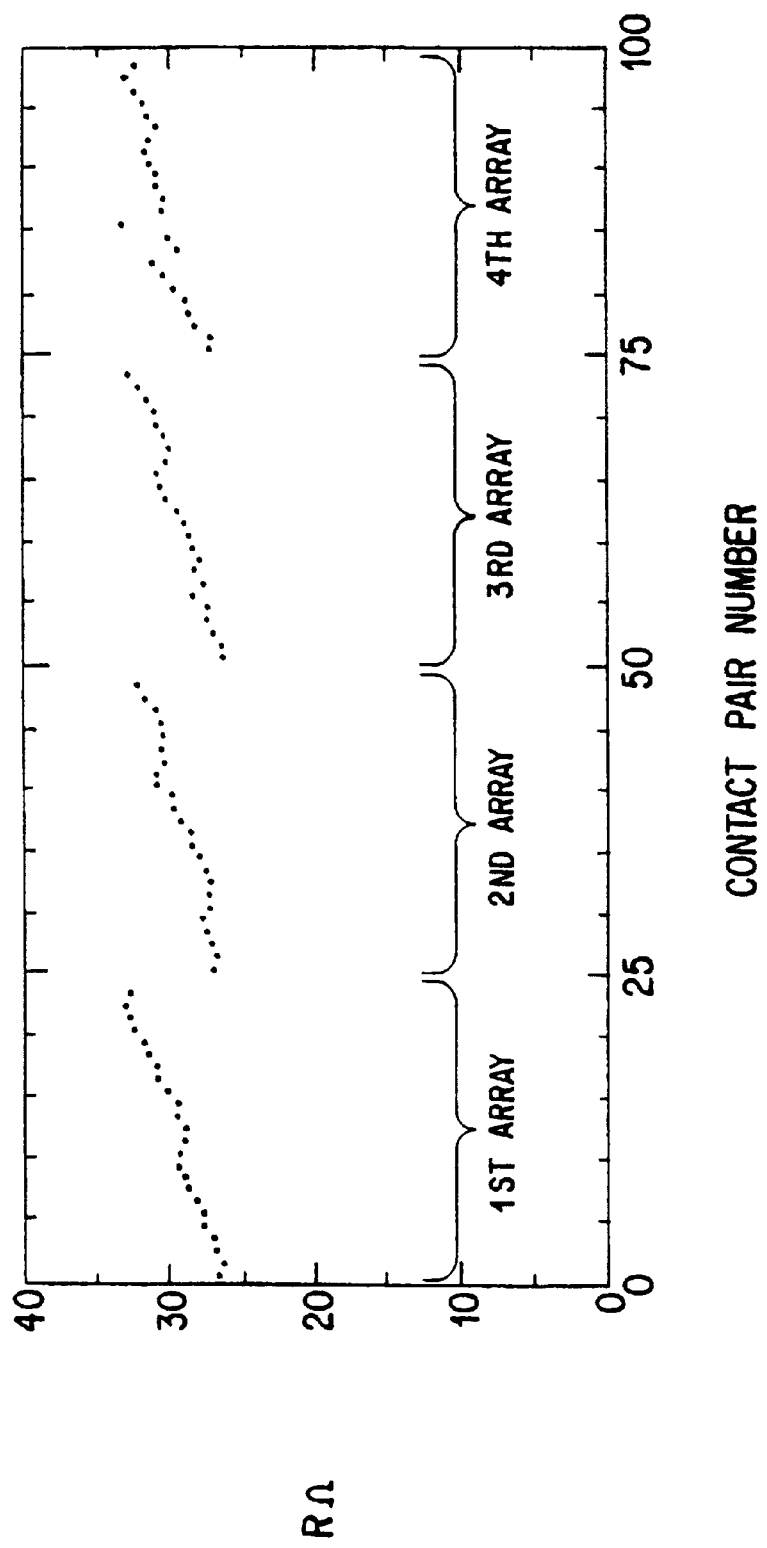
FIG. 17 is a graphical representation of the detected resistance of a plurality of spring contact pairs.

FIG. 17 graphically depicts the measured resistance R for each spring contact pair in the test apparatus. The measured resistance R within each array generally trends upward from left to right because of the increased conductor length of the spring contacts 15 positioned to the right compared to the spring contacts 15 positioned to the left in each array. Most of the approximately 25–30 ohms of resistance measured for each spring contact 15 pair is due to the length and geometry of the conductors extending between the spring contacts 15 and the resistance R probing points.

Figure 18:
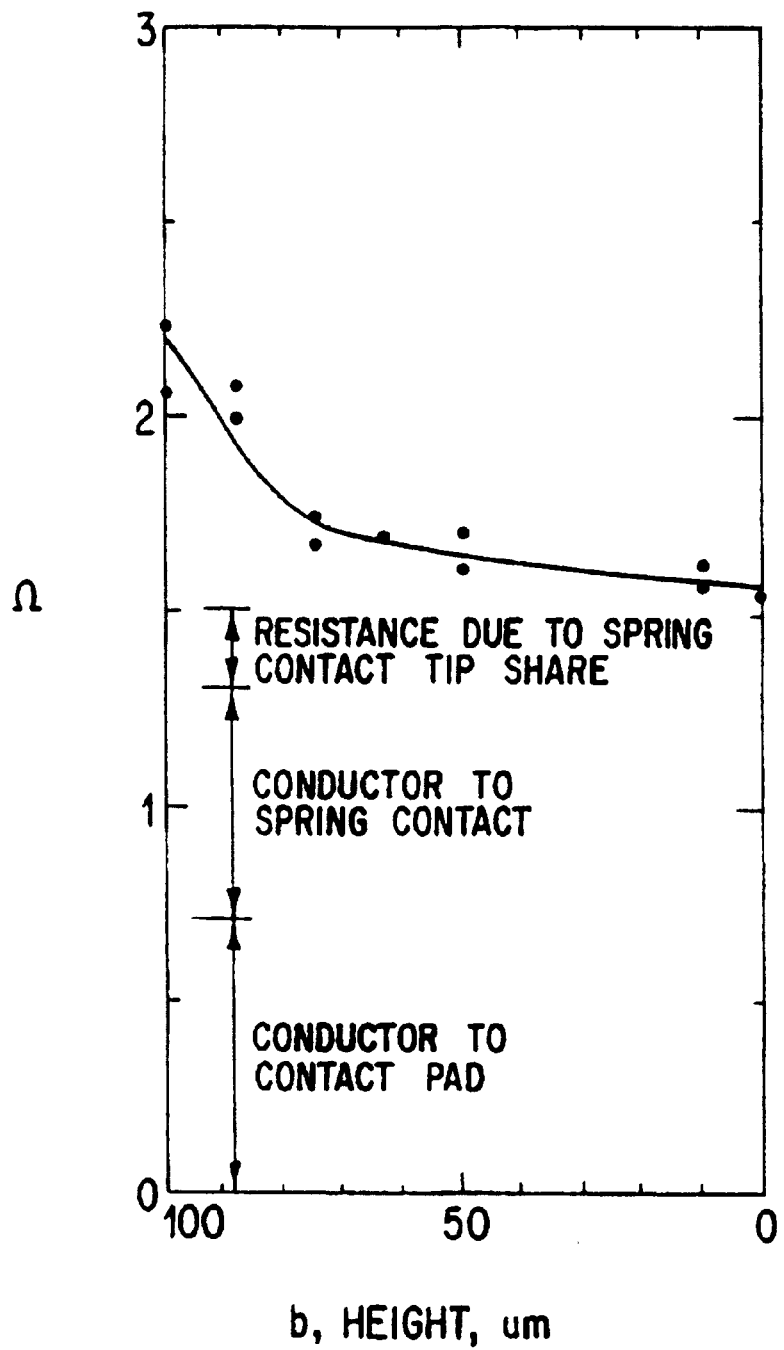
FIG. 18 is a graphic representation of the contact resistance of a spring contact as a function of the distance between the contact pad and the substrate.

FIG. 18 shows the total resistance of the connection between a spring contact 15 and corresponding contact pad 3 with most of the resistance R shown in FIG. 17 removed by using a 4-point probing geometry. As shown in FIG. 18, approximately 1.3 ohms of resistance is due to the conductors leading to the contact pad 3 and the spring contact 15. Approximately 0.2 ohms of resistance is due to the shape of the spring contact tip 30. The remaining resistance, approximately 0.1 ohms for b<80 µm, is the resistance at the interface between the contact pad 3 and the spring contact tip 30.

In general, the resistance at the interface between the contact pad 3 and the spring contact tip 30 decreases as the height b decreases. As mentioned above, the reaction force $F_{tip}$ that the spring contact tip 30 exerts against the contact pad 3 increases as the contact pad 3 pushes the spring contact tip 30 closer to the substrate 14. The increased reaction force $F_{tip}$ causes the spring contact tip 30 to locally deform at the contact pad 3, thereby increasing the contact area and decreasing the resistance at the interface.

Figure 19:
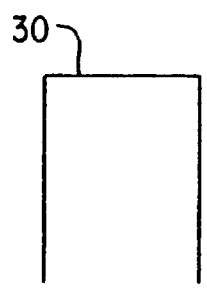
FIGS. 19–24 show a plurality of types of spring contact tips.
Figure 20:
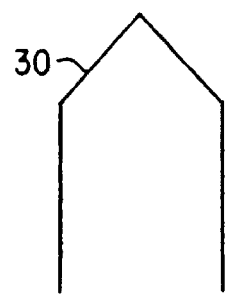
Figure 21:
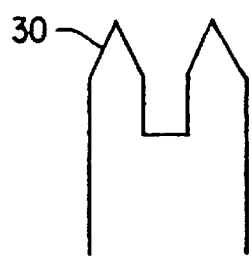
Figure 22:
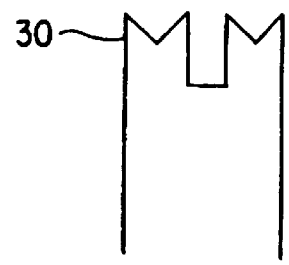
Figure 23:
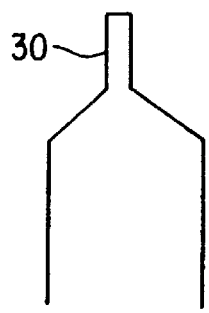
Figure 24:
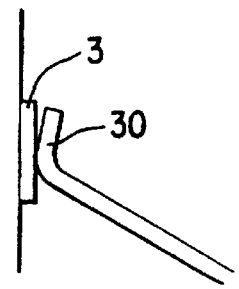

The shape of the spring contact tip 30 can take different forms, depending on the application. Since the spring contacts 15 are photolithographically patterned, the spring contact tips 30 are easily formed in a variety of shapes. FIG. 19 shows a spring contact tip 30 having a flat end. The spring contact tip 30 shown in FIG. 20 has a pointed end which concentrates the force $F_{tip}$ exerted by the spring contact 15 at a single point on the contact pad 3. This pointed shape aids the spring contact tip 30 when breaking through some oxides which may be present on the contact pads 3. FIGS. 21 and 22 show spring contact tips 30 having multiple points for applications where contact redundancy is required. FIG. 23 shows a spring contact tip 30 having a deformable tab. The deformable tab increases the contact area with the contact pad 3, by deforming as shown in FIG. 24 when the spring contact 15 forces the tip 30 against the contact pad 3.

Other methods are used to lower the contact resistance between the spring contact tip 30 and the contact pad 3. The spring contact tips 30 can be ultrasonically scrubbed into the contact pads 3 to increase the area of contact. Also, the spring contact tips 30 and the contact pads 3 can be coated with solder which is melted after the tips 30 and the contact pads 3 are brought into contact. Melting the solder bonds the spring contacts 15 to the contact pads 3.

Figure 25:
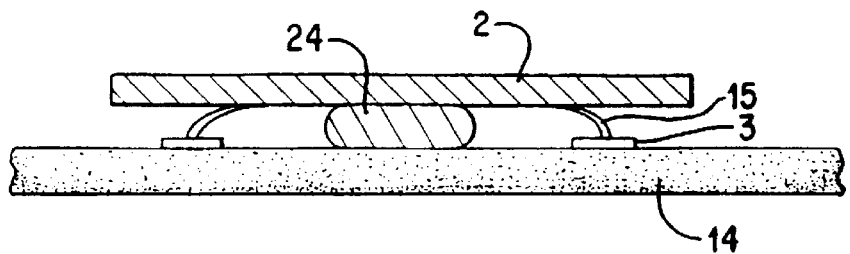
FIG. 25 is a chip having a plurality of spring contacts electrically bonded to a substrate.
Figure 26:
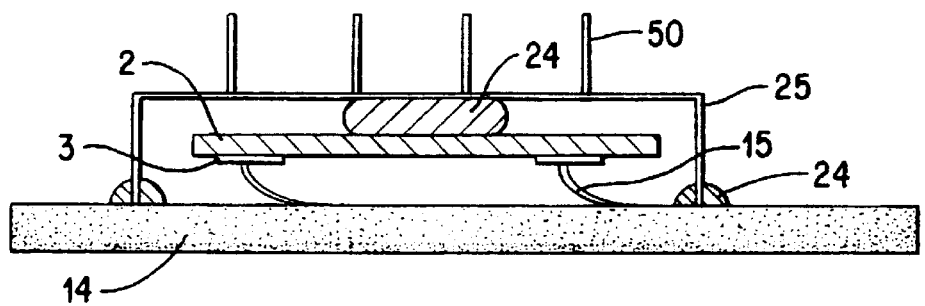
FIGS. 26 and 27 are chips electrically bonded to a substrate having a plurality of spring contacts and a dust cover.
Figure 27:
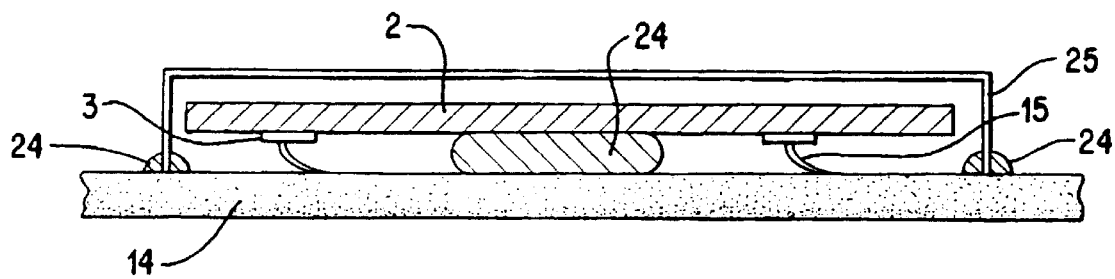

As mentioned above, since the production of the spring contacts 15 is limited only by the design rules of photolithographic patterning, the spring contacts 15 can be used to interconnect numerous different types of devices. For example, FIG. 25 shows one preferred embodiment of the invention. The spring contacts 15 are formed on the lower surface of the chip 2. The spring contacts 15 contact corresponding contact pads 3 on the substrate 14. The adhesive 24 holds the chip 2 stationary with respect to substrate 14. FIG. 26 shows the substrate 14 having a plurality of spring contacts 15 formed on the top surface of the substrate 14. The contact pads 3 formed on the lower surface of the chip 2 are electrically connected to corresponding spring contacts 15 on the substrate 14. An adhesive 24 holds the chip 2 stationary relative to a dust cover, or can, 25 covering the chip 2 and hermetically seals the dust cover 25 to the substrate 14. The dust cover 25 assures that moisture and other foreign substances do not corrode the spring contacts 15 or the contact pads 3, or otherwise interfere with the electrical connections between the individual spring contacts 15 and the corresponding contact pads 3. Optional cooling fins 50 and the dust cover 25 provide a heat sink to cool the chip 2. FIG. 27 shows an alternate form of the embodiment shown in FIG. 26. The adhesive 24 holds the chip 2 stationary to the substrate 14. No heat sink is provided by the dust cover 25.

Figure 28:
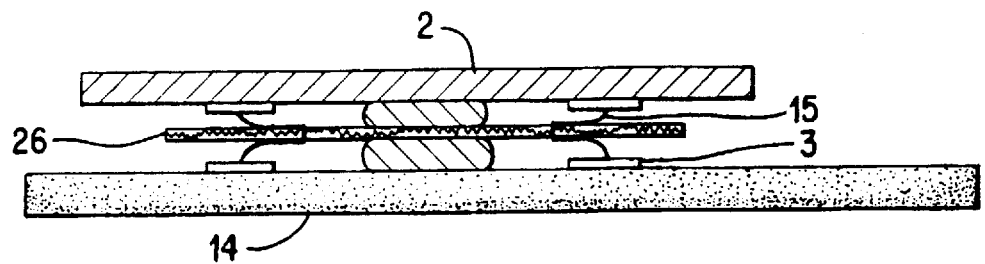
FIG. 28 is a chip electrically bonded to a substrate by way of an intermediate wafer having a plurality of spring contacts.

FIG. 28 shows an alternate embodiment of a connecting device for electrically connecting two devices. A wafer 26 is shown having a plurality of spring contacts 15 formed on opposite sides of the wafer. Pairs of the spring contacts 15 on opposite sides of the wafer 26 communicate with each other by way of vias etched in the wafer 26 and electrically connect the contact pads 3 on both the chip 2 and the substrate 14. This embodiment of the invention allows processing of the chip 2 and the substrate 14 without risking damage to the spring contacts 15. The wafer 26 is used to interconnect the chip 2 and the substrate 14 only after all processing is completed on the chip 2 and the substrate 14.

The spring contacts 15 are not limited to interconnecting a chip 2 to a substrate 14 or circuit board. The spring contacts 15 are used equally well to interconnect two chips 2, two circuit boards, or other electronic devices to each other. Two exemplary applications are mounting driver chips to visual displays and assembling multi-chip modules (MCM's) for computers. Another alternative use for the spring contacts 15 is in probe cards. As discussed above, probe cards 7 are used to temporarily connect two devices, typically when one of the devices is tested. Such testing is common in the semiconductor industry, where the probe cards 7 are used to test semiconductor chips while the chips are still part of a single-crystal silicon wafer.

Figure 29:
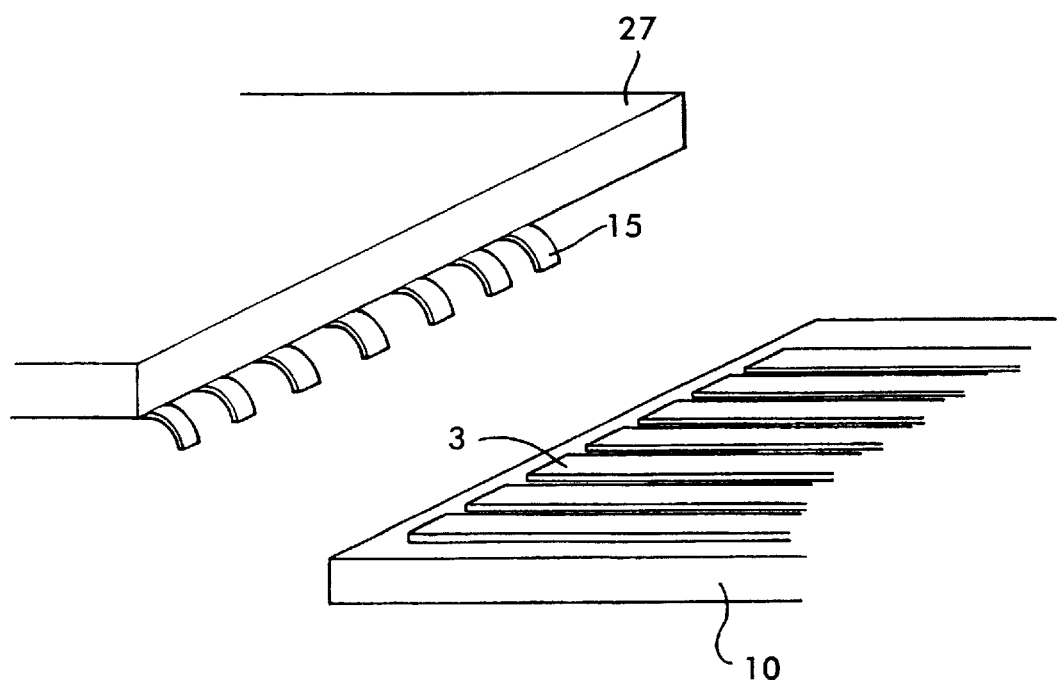
FIG. 29 is a probe card having a plurality of spring contacts used for testing an electronic device.

FIG. 29 shows an embodiment of the invention where the probe card 27 has an array of spring contacts 15 used in place of the standard probe needles 8. The probe card 27 operates identically to the standard probe card 7 except for having spring contacts 15. The probe card 27 is aligned with the device 10 such that the spring contacts 15 compliantly contact the corresponding contact pads 3 on the device 10. The device 10 is then tested or communicated with by a testing device electrically connected to the probe card 27.

Figure 30:
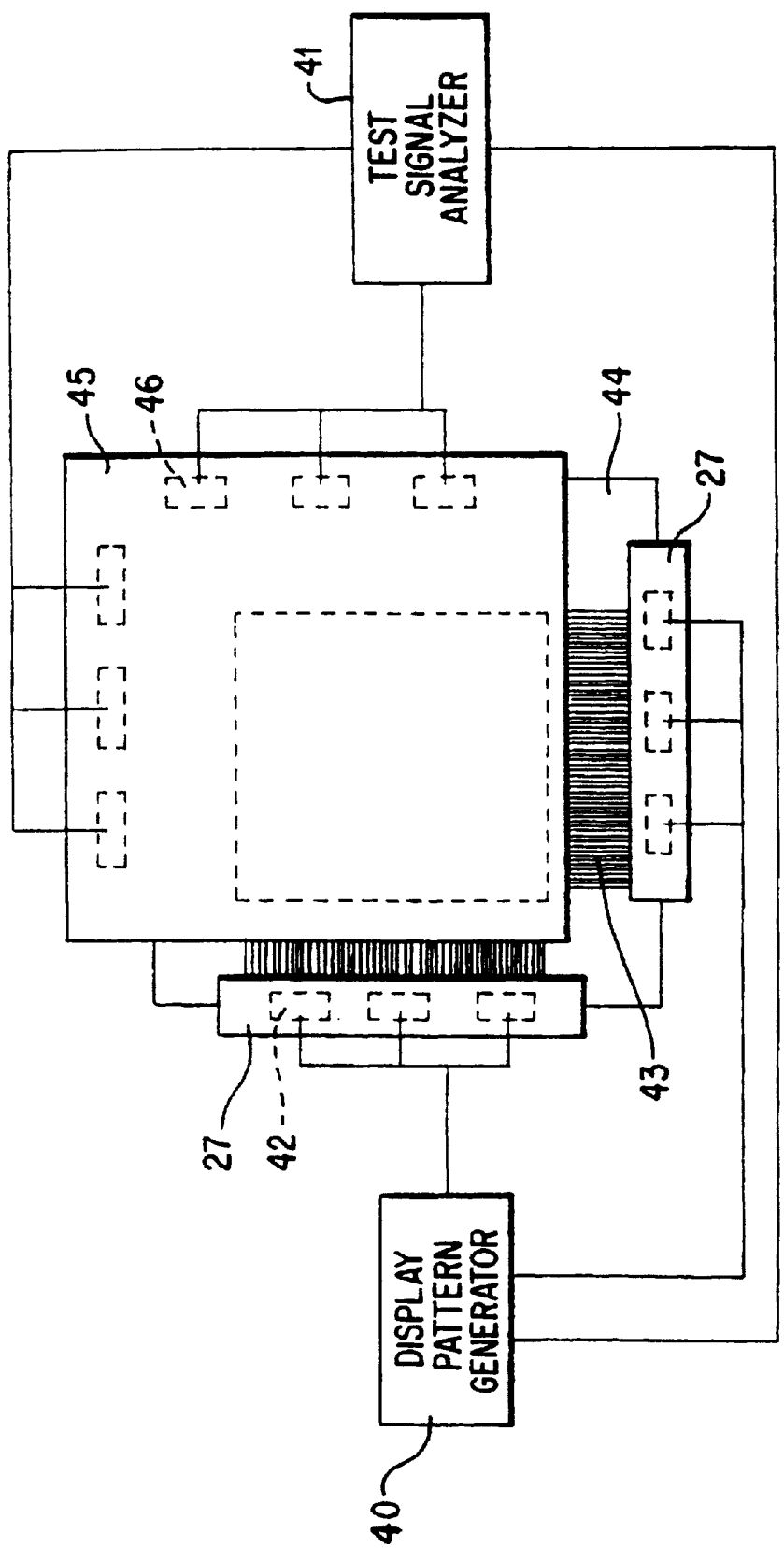
FIG. 30 is a liquid crystal display and a device for testing the operation of the display.

An example testing device is shown in FIG. 30 which is more thoroughly described in the U.S. patent application 08/473,912 filed concurrently herewith. A display pattern generator 40 communicates with driver chips 42 mounted on the two full-width probe cards 27. The probe cards 27 have the spring contacts 15 which contact associated addressing lines 43 formed on the display plate 44. The addressing lines 43 communicate with display electrodes (not shown). Therefore, the display pattern generator 40 can drive the display electrodes to produce a matrix of electric potentials corresponding to a test image. Sensors (not shown) on the sensor plate 45 detect the matrix of electric potentials on the display electrodes and generate signals each corresponding to the electric potential. The signals are read out by scanner chips 46 mounted on the sensor plate 45. The test signal analyzer 41 receives the signals from the scanner chips 46 and forms a sensed image corresponding to the signals. The test signal analyzer 41 then compares the sensed image with the test image output by the display pattern generator 40 to determine if the display plate 44 and display electrodes are working properly.

Since producing a standard probe card 7 having probe needles 8 is labor intensive and time-consuming, standard probe cards 7 are not generally made to contact all of the addressing lines 43 on the display plate 44. Therefore, testing of the display plate 44 must be done in sections since the probe cards 7 cannot accommodate the full width of the addressing lines 43. In contrast, the probe card 27 made with spring contacts 15 can be made easily and inexpensively. Also, the probe cards 27 having the spring contacts 15 can be made to any width and therefore can test all of the data or address lines of an apparatus, such as the display shown in FIG. 30, at one time.

In another example, wafer-scale testing and burning-in of chips 2 can be performed by a single probe card 27 contacting all contact pads 3 of all chips 2 while the chips 2 are still part of a single semiconductor wafer. The probe card 27 can be a silicon wafer containing microcircuitry to distribute test signals to and from each chip 2 on the wafer under test. The test signals can be distributed either all at once or sequentially to the chips 2.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention as set forth in the following claims.

What is claimed is:

1. A method for forming a contact, comprising the steps of:
    fixing a first layer of an elastic material to a substrate so that the first layer is attached to the substrate;
    fixing at least one additional layer of the elastic material to the first layer so the at least one additional layer has a different level of inherent stress than the first layer and so the first layer and at least one additional layer form an elastic member composed of a single elastic material; and
    releasing a portion of the first layer from the substrate;
    wherein the released portion of the first layer is forced by an inherent stress gradient in the layers to move away from the substrate.

2. The method of claim 1, further comprising:
    selectively removing portions of the first layer and the at least one additional layer to form a desired contact shape.

3. The method of claim 1, further comprising:
    annealing at least a portion of the first layer and the at least one additional layer to remove stress in the layers.

4. The method of claim 1, further comprising:
    forming electronic circuitry on the substrate that communicates with at least one contact on the substrate.

5. The method of claim 4, wherein the step of forming electronic circuitry comprises:
    forming electronic data processing elements in a semiconductor substrate.

6. A method of forming a contact, comprising the steps of:
    fixing an elastic member consisting of a single elastic material having an inherent stress gradient to a substrate so that the elastic material is attached to the substrate; and
    releasing a portion of the elastic material from the substrate so that the inherent stress gradient forces the portion of the elastic material to bend away from the substrate.

7. The method of claim 6, further comprising:
    selectively removing portions of the elastic material to form a desired contact shape.

8. The method of claim 6, further comprising:
    annealing at least a portion of the elastic material to remove stress.

9. The method of claim 6, further comprising:
    forming electronic circuitry on the substrate that communicates with at least one contact on the substrate.

10. The method of claim 9, wherein the step of forming electronic circuitry comprises:
    forming electronic data processing elements in a semiconductor substrate.

11. The method of claim 6, wherein the elastic material is electrically conductive.

12. The method of claim 6, further comprising forming a layer of electrically conductive material on at least one side of the elastic material.

13. The method of claim 6, further comprising:
    bonding a portion of the contact to a surface other than the substrate.

14. The method of claim 13, wherein the step of bonding comprises:
    coating one of the contact and the surface with solder; and
    melting the solder to bond the contact to the surface.

15. A method of forming a probe card, comprising:
    providing a substrate;
    fixing an elastic member consisting of a single elastic material to the substrate so that an inherent stress gradient is formed in the elastic material;
    releasing a portion of the elastic material so that the inherent stress gradient forces a portion of the elastic member away from the substrate; and
    forming electronic circuitry on the substrate that communicates with the elastic material.

16. The method of claim 15, further comprising:
    selectively removing portions of the elastic material to form a plurality of individual spring contacts.

17. The method of claim 16, wherein the step of forming electronic circuitry comprises:
    forming conductive leads that each electrically communicate with a corresponding spring contact; and
    forming a plurality of switching elements that communicate with the conductive leads and selectively operate to allow communication between individual spring contacts.

18. The method of claim 15, further comprising:
    annealing at least a portion of the elastic material to remove stress.

19. The method of claim 15, wherein the elastic material is electrically conductive.

20. The method of claim 15, further comprising forming a layer of electrically conductive material on at least one side of the elastic material.

21. The method of claim 1, further comprising:
    providing the substrate to which the first layer is fixed as comprising one of silicon, silicon dioxide and silicon nitride.

22. The method of claim 1, further comprising:
fixing a second material to at least a portion of the elastic member, the second material consisting of one of solder, gold, and a passivating material.

23. The method of claim 1, further comprising:
forming a desired tip shape on a free end of the elastic member to contact a contact surface opposite the substrate.

24. The method of claim 1, wherein the at least one additional layer is fixed to the first layer so that the elastic member has no discontinuous interface between layers.

25. The method of claim 1, wherein the step of fixing at least one additional layer comprises varying the inherent stress in the at least one additional layer by one of including a reactive gas to a sputter deposition plasma, depositing the at least one additional layer at an angle, and changing a pressure of a sputter deposition plasma gas.

26. The method of claim 1, wherein the step of releasing a portion of the first layer comprises heating a portion of the substrate to release the portion of the first layer.

27. The method of claim 1, further comprising forming etching windows in the first and at least one additional layers.

28. The method of claim 1, further comprising:
ultrasonically scrubbing a tip of the released portion into a contact pad.

29. The method of claim 1, further comprising:
forming a plurality of spring contacts from the first and at least one additional layer; and
electrically contacting each of the plurality of spring contacts to a corresponding contact pad on a device to be tested.

30. The method of claim 1, further comprising packaging the elastic member inside of a hermetically-sealed cover.

31. The method of claim 30, wherein the elastic member is packaged along with a device that is electrically connected to at least the released portion inside of a hermetically-sealed cover.

32. The method of claim 6, further comprising:
providing the substrate to which the elastic material is fixed as comprising one of silicon, silicon dioxide and silicon nitride.

33. The method of claim 6, further comprising:
fixing a second material to at least a portion of the elastic member, the second material consisting of one of solder, gold, and a passivating material.

34. The method of claim 6, further comprising:
forming a desired tip shape on a free end of the elastic member to contact a contact surface opposite the substrate.

35. The method of claim 6, wherein the elastic member comprises constituent layers of the single elastic material and there is no discontinuous interface between the constituent layers of the single elastic material.

36. The method of claim 6, wherein the step of fixing an elastic member comprises varying the inherent stress in the elastic member by one of including a reactive gas to a sputter deposition plasma, sputter depositing the elastic material at an angle, and changing a pressure of a sputter deposition plasma gas.

37. The method of claim 6, wherein the step of releasing a portion of the elastic material comprises heating a portion of the substrate to release the portion of the elastic material.

38. The method of claim 6, further comprising forming etching windows in the elastic member.

39. The method of claim 6, further comprising:
ultrasonically scrubbing a tip of the released portion into a contact pad.

40. The method of claim 6, further comprising:
forming a plurality of spring contacts from the elastic material; and
electrically contacting each of the plurality of spring contacts to a corresponding contact pad on a device to be tested.

41. The method of claim 6, further comprising packaging the elastic member inside of a hermetically-sealed cover.

42. The method of claim 41, wherein the elastic member is packaged along with a device that is electrically connected to at least the released portion inside of a hermetically-sealed cover.

43. The method of claim 15, further comprising:
providing the substrate to which the first layer is fixed as comprising one of silicon, silicon dioxide and silicon nitride.

44. The method of claim 15, further comprising:
fixing a second material to at least a portion of the elastic member, the second material consisting of one of solder, gold, and a passivating material.

45. The method of claim 15, further comprising:
forming a desired tip shape on a free end of the elastic member to contact a contact surface opposite the substrate.

46. The method of claim 15, wherein the elastic member comprises constituent layers of the single elastic material and there is no discontinuous interface between the constituent layers of the single elastic material.

47. The method of claim 15, wherein the step of fixing an elastic member comprises varying the inherent stress in the elastic member by one of including a reactive gas to a sputter deposition plasma, sputter depositing the elastic material at an angle, and changing a pressure of a sputter deposition plasma gas.

48. The method of claim 15, wherein the step of releasing a portion of the elastic material comprises heating a portion of the substrate to release the portion of the elastic material.

49. The method of claim 15, further comprising forming etching windows in the elastic material.

50. The method of claim 15, further comprising:
ultrasonically scrubbing a tip of the released portion into a contact pad.

51. The method of claim 15, further comprising:
forming a plurality of spring contacts from the elastic material; and
electrically contacting each of the plurality of spring contacts to a corresponding contact pad on a device to be tested.

52. A method of forming a contact, comprising the steps of:
providing a substrate consisting of one of silicon, silicon dioxide and silicon nitride;
fixing a single elastic material having an inherent stress gradient to the substrate so that the elastic material is attached to the substrate; and
releasing a portion of the elastic material from the substrate so that the inherent stress gradient forces the portion of the elastic material to bend away from the substrate.

53. The method of claim 52, further comprising:
selectively removing portions of the elastic material to form a desired contact shape.

54. The method of claim 52, further comprising:
    annealing at least a portion of the elastic material to remove stress.
55. The method of claim further comprising:
    forming electronic circuitry on the substrate that communicates with the elastic material.
56. The method of claim 52, wherein the step of forming electronic circuitry comprises:
    forming electronic data processing elements in a semiconductor substrate.
57. The method of claim 52, wherein the elastic material is electrically conductive.
58. The method of claim 52, further comprising forming a layer of electrically conductive material on at least one side of the elastic material.
59. The method of claim 52, further comprising:
    bonding a portion of the contact to a surface other than the substrate.
60. The method of claim 59, wherein the step of bonding comprises:
    coating one of the contact and the surface with solder; and
    melting the solder to bond the contact to the surface.
61. The method of claim 52, further comprising:
    fixing a second material to at least a portion of the elastic material, the second material consisting of one of solder, gold, and a passivating material.
62. The method of claim 52, further comprising:
    forming a desired tip shape on a free end of the elastic material to contact a contact surface opposite the substrate.
63. The method of claim 52, wherein the elastic material comprises constituent layers and there is no discontinuous interface between the constituent layers.
64. A method of forming a contact, comprising the steps of:
    fixing an elastic material having an inherent stress gradient to a substrate so that the elastic material is attached to the substrate;
    releasing a portion of the elastic material from the substrate so that the inherent stress gradient forces the portion of the elastic material to bend away from the substrate; and
    annealing at least a part of the elastic material.
65. The method of claim 64, further comprising:
    providing the substrate to which the elastic material is fixed as comprising one of silicon, silicon dioxide and silicon nitride.
66. The method of claim 64, further comprising:
    fixing a second material to at least a portion of the elastic material, the second material consisting of one of solder, gold, and a passivating material.
67. The method of claim 64, further comprising:
    forming a desired tip shape on a free end of the elastic material to contact a contact surface opposite the substrate.
68. The method of claim 64, wherein the elastic material comprises constituent layers of the single elastic material and there is no discontinuous interface between the constituent layers of the single elastic material.
69. The method of claim 64, wherein the step of fixing an elastic material comprises varying the inherent stress in the elastic material by one of including a reactive gas to a sputter deposition plasma, sputter depositing the elastic material at an angle, and changing a pressure of a sputter deposition plasma gas.

70. The method of claim 64, wherein the step of releasing a portion of the elastic material comprises heating a portion of the substrate to release the portion of the elastic material.
71. The method of claim 64, further comprising forming etching windows in the elastic material.
72. The method of claim 64, further comprising:
    ultrasonically scrubbing a tip of the released portion into a contact pad.
73. The method of claim 64, further comprising:
    forming a plurality of spring contacts from the elastic material; and
    electrically contacting each of the plurality of spring contacts to a corresponding contact pad on a device to be tested.
74. A method of forming a contact, comprising the steps of:
    fixing an elastic material having an inherent stress gradient to a substrate so that the elastic material is attached to the substrate; and
    releasing a portion of the elastic material from the substrate by heating a portion of the substrate so that the inherent stress gradient forces the portion of the elastic material to bend away from the substrate.
75. A method of forming a contact, comprising the steps of:
    fixing an elastic material having an inherent stress gradient to a substrate so that the elastic material is attached to the substrate;
    etching windows in the elastic material; and
    releasing a portion of the elastic material from the substrate so that the inherent stress gradient forces the portion of the elastic material to bend away from the substrate.
76. A method of forming a contact, comprising the steps of:
    fixing an elastic material having an inherent stress gradient to a substrate so that the elastic material is attached to the substrate;
    releasing a portion of the elastic material from the substrate so that the inherent stress gradient forces the portion of the elastic material to bend away from the substrate; and
    ultrasonically scrubbing a tip of the released portion into a contact pad.
77. A method of forming a contact, comprising the steps of:
    fixing a single elastic material having an inherent stress gradient to a substrate so that the elastic material is attached to the substrate;
    releasing a portion of the elastic material from the substrate so that the inherent stress gradient forces the portion of the elastic material to bend away from the substrate; and
    packaging the elastic material inside of a hermetically-sealed cover.
78. The method of claim 76, further comprising:
    annealing at least a portion of the elastic material to remove stress.
79. The method of claim 77, further comprising:
    annealing at least a portion of the elastic material to remove stress.

* * * * *